United States Patent
Schnell et al.

(10) Patent No.: US 7,397,727 B2
(45) Date of Patent: Jul. 8, 2008

(54) WRITE BURST STOP FUNCTION IN LOW POWER DDR SDRAM

(75) Inventors: Josef Schnell, Charlotte, VT (US); Meg Freebern, Richmond, VT (US)

(73) Assignee: Infineon Technologies Ag, Neubiberg (DE)

( * ) Notice: Subject to any disclaimer, the term of this patent is extended or adjusted under 35 U.S.C. 154(b) by 293 days.

(21) Appl. No.: 11/314,529

(22) Filed: Dec. 22, 2005

(65) Prior Publication Data

US 2007/0147142 A1 Jun. 28, 2007

(51) Int. Cl.
*G11C 8/04* (2006.01)
*G11C 8/18* (2006.01)
*G11C 7/22* (2006.01)
*G11C 7/10* (2006.01)

(52) U.S. Cl. .................. 365/239; 365/193; 365/221; 365/238.5; 365/195

(58) Field of Classification Search .................. 365/239, 365/221, 195, 194, 193, 238.5; 711/217, 711/218, 219, E12.053, E12.054
See application file for complete search history.

(56) References Cited

U.S. PATENT DOCUMENTS

| | | | |
|---|---|---|---|
| 5,749,086 A | 5/1998 | Ryan | |
| 6,208,582 B1 | 3/2001 | Kanda et al. | |
| 6,240,043 B1 | 5/2001 | Hanson et al. | |
| 6,754,134 B1 | 6/2004 | Sunaga | |

*Primary Examiner*—J. H. Hur
(74) *Attorney, Agent, or Firm*—Edell, Shapiro & Finnan, LLC

(57) ABSTRACT

A write burst stop command function is provided for a semiconductor memory device, and in particular for a memory device having a write latency, such as is common in a low power double data rate (DDR) dynamic random access memory (DRAM) device. In the memory device, when a write stop command is received, pulses that are generated for a column address strobe signal are terminated so that no further data already in the memory device is transferred into a memory array. When the write stop command is received at the beginning of a write operation prior to generation of the pulses in the column address strobe signal, a first-in first-out (FIFO) circuit is reset. The FIFO circuit is used to introduce a predetermined write latency to the write operation. The column address strobe signal is supplied to a column decoder associated with the memory array and to a data path circuit that transfers data to the memory array based on pulses in the column address strobe signal. In one embodiment, the pulses for the column address strobe signal are produced by a latch circuit based on a signal derived from the output of the write latency FIFO circuit and so an input to the latch is disabled in response to the write stop command to stop producing pulses for the column address strobe signal.

9 Claims, 5 Drawing Sheets

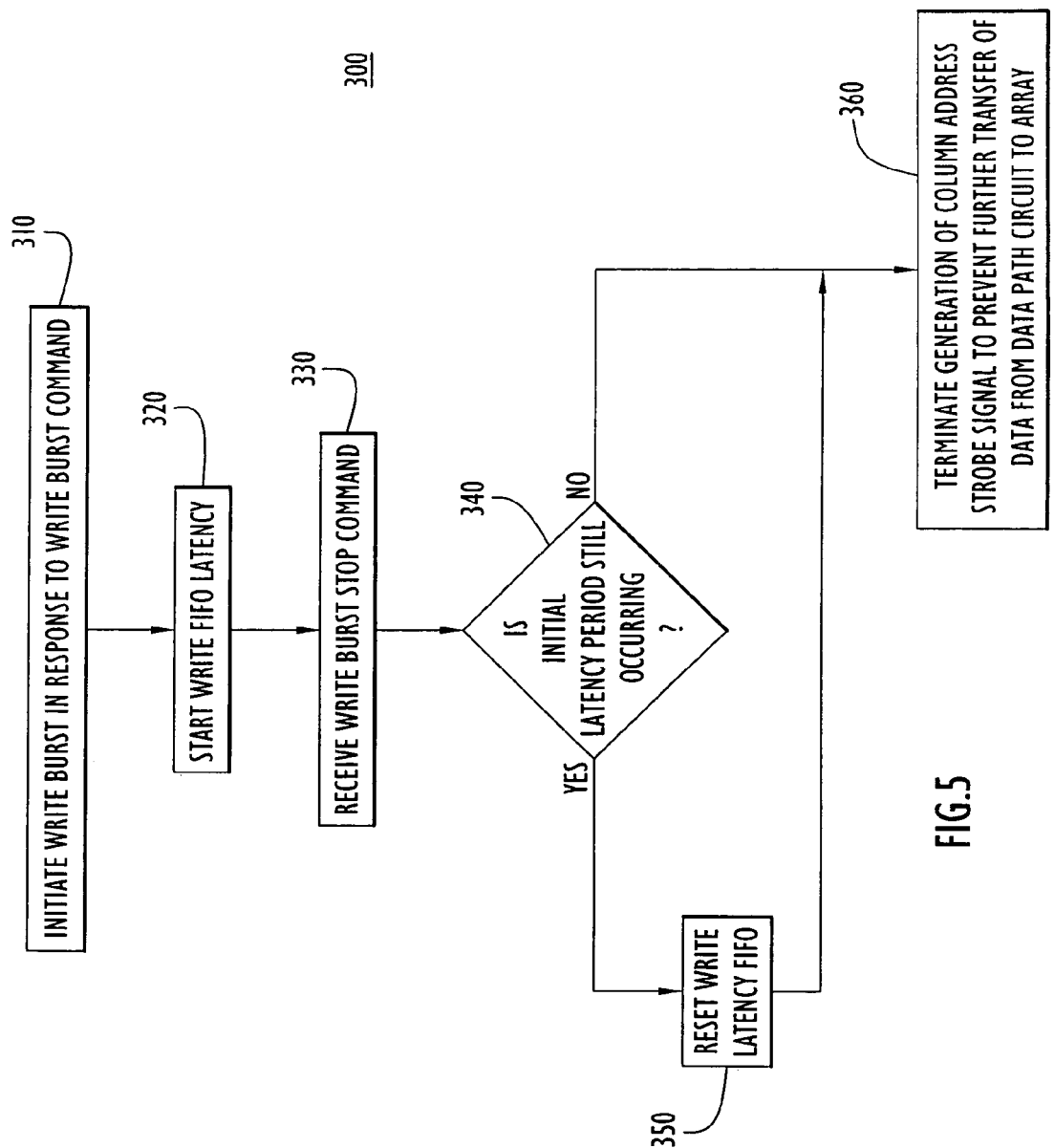

WRITE BURST STOP FUNCTION IN LOW POWER DDR SDRAM

BACKGROUND OF THE INVENTION

The present invention is directed to semiconductor devices, and more particularly to stopping a write burst function in a semiconductor integrated circuit memory device, such as a low power double data rate (DDR) dynamic random access memory (DRAM) device.

In certain semiconductor memory devices, such as DRAM devices designed for lower power consumption applications, such as portable computing devices (laptops, PDAs, etc.), the length (amount of data) of a write burst is longer than commodity DRAMs designed for less restricted power applications. These types of write burst operations are also called full page bursts.

The host device may need to stop the write burst due to host device application requirements. For example, a host device application may need to urgently read out data and must interrupt an ongoing write burst to do so. An undesirable alternative to interrupting the write burst is to close the memory array with a precharge cycle.

Write burst interrupts are known in single data rate (SDR) DRAM devices, but not in memory devices that have an internal write latency, such as DDR DRAM devices.

SUMMARY OF THE INVENTION

Briefly, a method and circuitry are provided for interrupting a write operation in a semiconductor memory device. In the memory device, when a write stop command is received, pulses that are generated for a column address strobe signal are terminated so that no further data already in the memory device is transferred into a memory array. When the write stop command is received at the beginning of a write operation prior to generation of the pulses in the column address strobe signal, a first-in first-out (FIFO) circuit is reset. The FIFO circuit is used to introduce a predetermined write latency to the write operation. The column address strobe signal is supplied to a column decoder associated with the memory array and to a data path circuit that transfers data to the memory array based on pulses in the column address strobe signal.

BRIEF DESCRIPTION OF THE DRAWINGS

FIG. 5 is a flow chart depicting the operation of the write burst interrupt function according to an exemplary embodiment of the invention.

DETAILED DESCRIPTION

Figure 1:
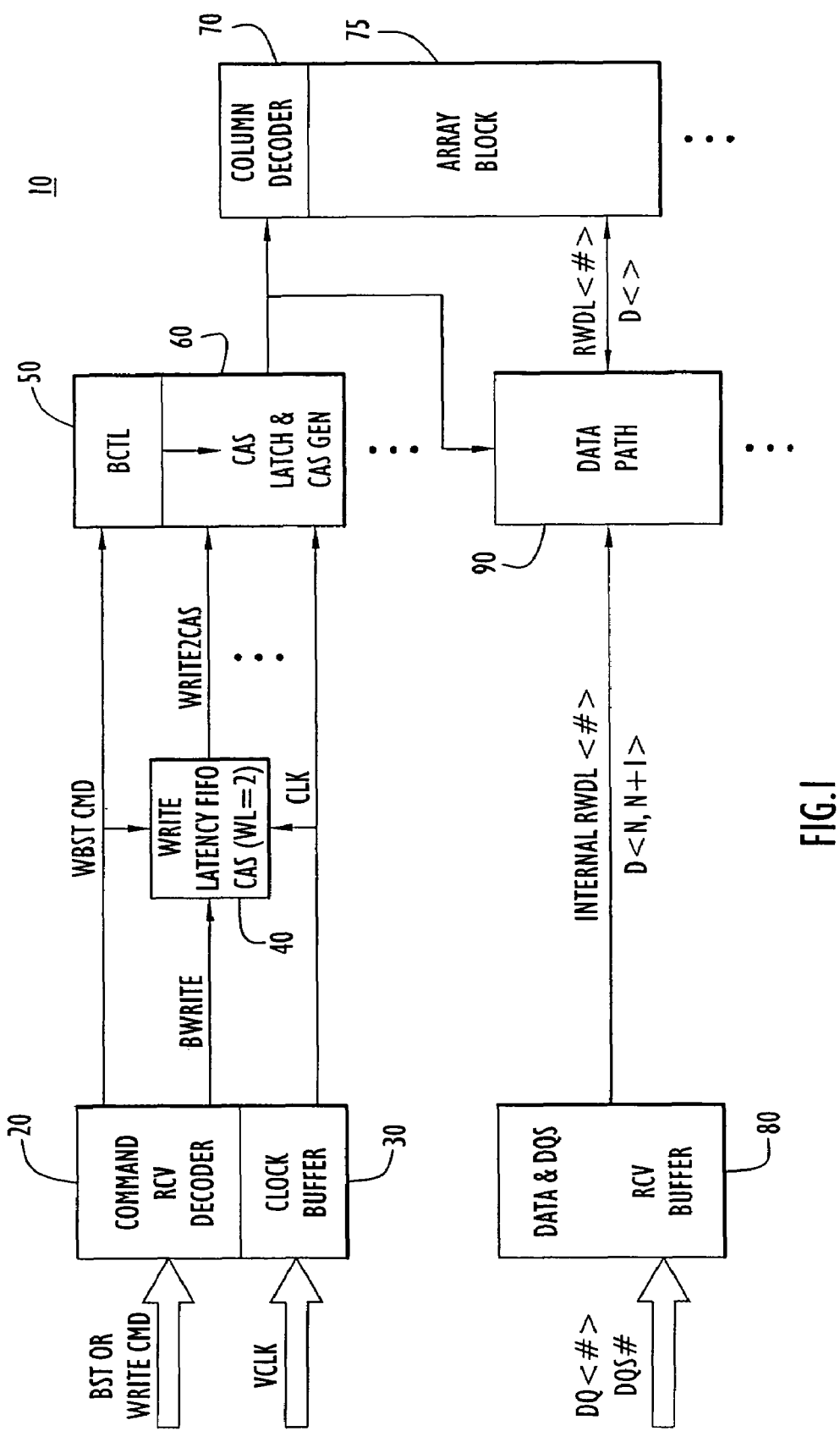
FIG. 1 is a block diagram of the memory device circuits that pertain to the write burst interrupt function according to the invention.

Referring first to FIG. 1, the circuitry in a semiconductor memory device 10 that is relevant to the write burst stop function is shown. There is a command receive decoder 20 that receives command signals from a host device (not shown) including, in particular, a write command (WRITE CMD) signal and a burst stop command (BST) signal. There is also a clock buffer circuit 30 that receives a clock signal (VCLK) supplied by the host device. The command receive decoder 20 is connected to a write latency first-in first-out (FIFO) circuit 40 and to a burst control circuit (BCTL) 50. The clock buffer 30 is also connected to the write latency FIFO 40 and to a column address strobe (CAS) latch and CAS generator circuit 60. The CAS latch and CAS generator circuit 60 is connected to a column decoder 70 and memory cell array 75 for a memory bank. The memory device 10 may have multiple memory banks and the circuits 40 and 60 are repeated for the memory array of each bank.

Data received at the memory device 10 to be written into the memory array 75 is received at a receive buffer 80 which is in turn connected to a data path circuit 90. The data path circuit 90 is responsive to the CAS signal to transfer data already supplied to the memory device 10 and residing in the receive buffer 80, into the memory array 75.

The command receive decoder 20 is responsive to the WRITE CMD signal to generate a burst write signal (BWRITE) that is supplied to the write latency FIFO 40, which in turn, after a write latency of two clock cycles (WL=2), for example, generates a write CAS signal (WRITE2CAS) that is supplied to the CAS latch and CAS generator circuit 60. It should be understood that the write latency may be longer or shorter depending on the particular memory device design, and this is only an example, not intended to limit the present invention in any way. The command receiver decoder 20 is also responsive to the BST command signal to generate a write burst stop command signal (WBST CMD) that is supplied to the BCTL circuit 50. The BCTL circuit 50 blocks the CAS signal to the data path circuit 90 and to the column decoder 70 in response to receiving a WBST CMD signal from the command receive decoder.

Figure 2:
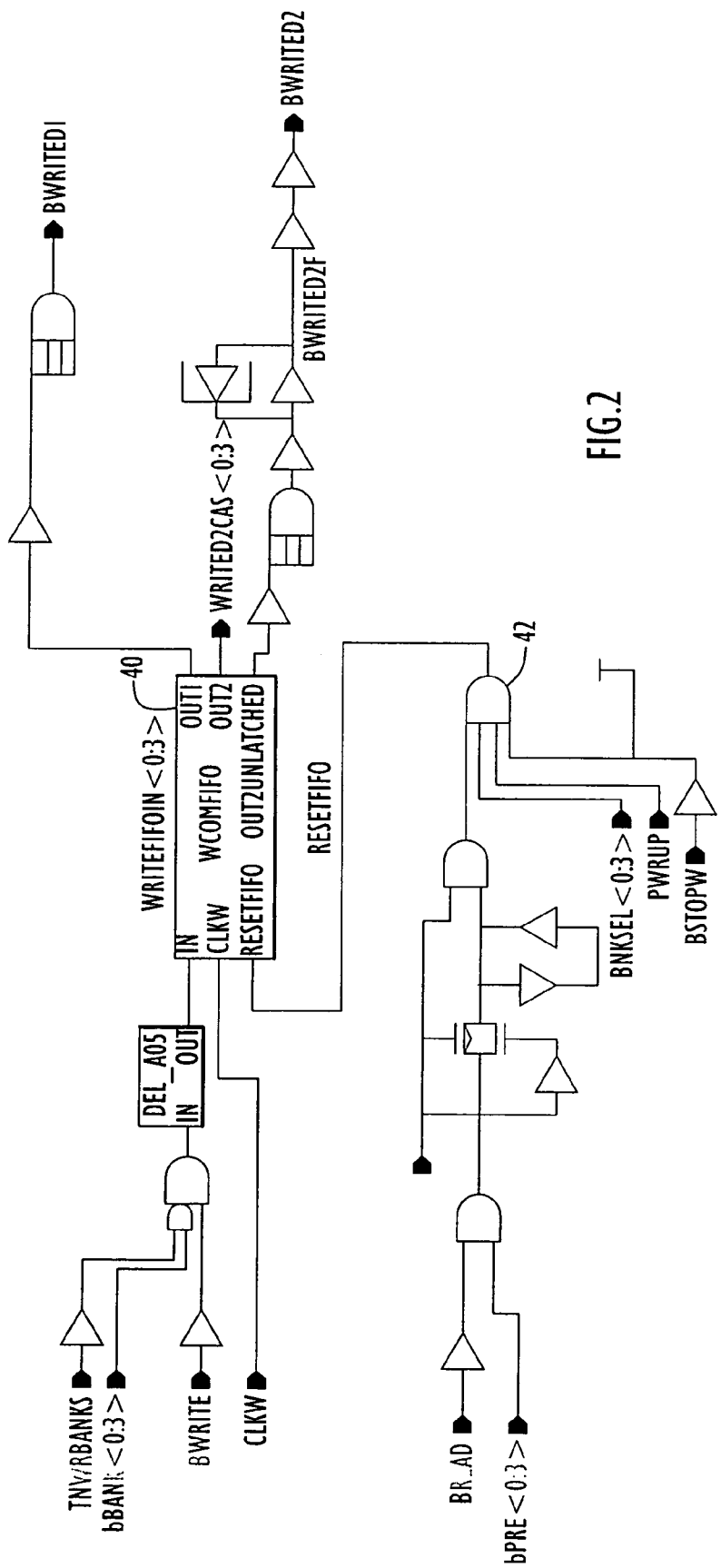
FIG. 2 is a detailed block diagram of the digital logic circuitry used to reset a write latency FIFO circuit according to an embodiment of the invention.

Turning to FIG. 2, the operation of the write FIFO circuit and associated digital logic circuitry will be described as it relates to the burst write termination functionality. The write FIFO is shown at reference numeral 40 in the center of the diagram and is labeled WCOMFIFO in this figure. The WCOMFIFO circuit 40 has an input (IN), a clock input (CLKW), a reset input (RESETFIFO) and two outputs (OUT1, OUT2). The input to the WCOMFIFO circuit 40 is the signal WRITEFIFOIN<0:3>. A signal RESETFIFO is coupled to the reset input of the WCOMFIFO circuit 40. The output at OUT2 of the WCOMFIFO block is the signal WRITED2CAS<0:3> that is an input to the circuitry shown in FIG. 3 for the corresponding memory bank based on the bank address.

The normal operation for non-terminated bursts of the FIFO related circuitry shown in FIG. 2 is as follows. The command receive decoder 20 decodes the WRITE CMD and creates the input signal BWRITE (high for one cycle only). This is combined with the bank address given for the write command on signal bBANK<0:3> to create bank specific write pulses WRITEFIFOIN <0:3>. The signal WRITEFIFOIN<0:3> is latched by the clock signal coupled to the CLKW input on the WCOMFIFO circuit 40. Because of the two cycles of write latency, the write command is shifted by two cycles inside the WCOMFIFO circuit 40 to create WRITED2CAS<0:3>. "WRITED2CAS" stands for "write delayed by 2 for the CAS generation" and the "<0:3>" indicates that it is bank specific and in this example there are four banks. This signal goes to the CAS generation block circuitry shown in FIG. 3 to create the first CAS pulse for a write operation. WRITED2CAS<0:3> is also referred to hereinafter as the column address strobe control signal and it includes a delay corresponding to the write latency period (in terms of a predetermined number of clock cycles) of the memory device.

For a write operation that is terminated with a BST command occurring at the beginning of the write burst operation on the first or second cycle of the burst (the "initial write latency period") before the first CAS pulse has been issued, the operation of the circuitry in FIG. 2 is as follows. The BWRITE command is clocked into the WCOMFIFO circuit 40 as explained above. The command receive decoder 20 decodes the BSTOP command and latches it to create the input signal BSTOP. In a circuit not shown, BSTOP is combined with the state of the memory device (read or write) to form the signal BSTOPW. A rising BSTOPW signal (high) creates a low input to the NAND gate 42, which creates a high value on RESETFIFO. When RESETFIFO signal rises, all stages of the WCOMFIFO circuit 40 are reset to 0, ending any write that would occur. In this way, a write burst stop issued before any CAS pulses have occurred would prevent all CAS pulses.

Figure 3:
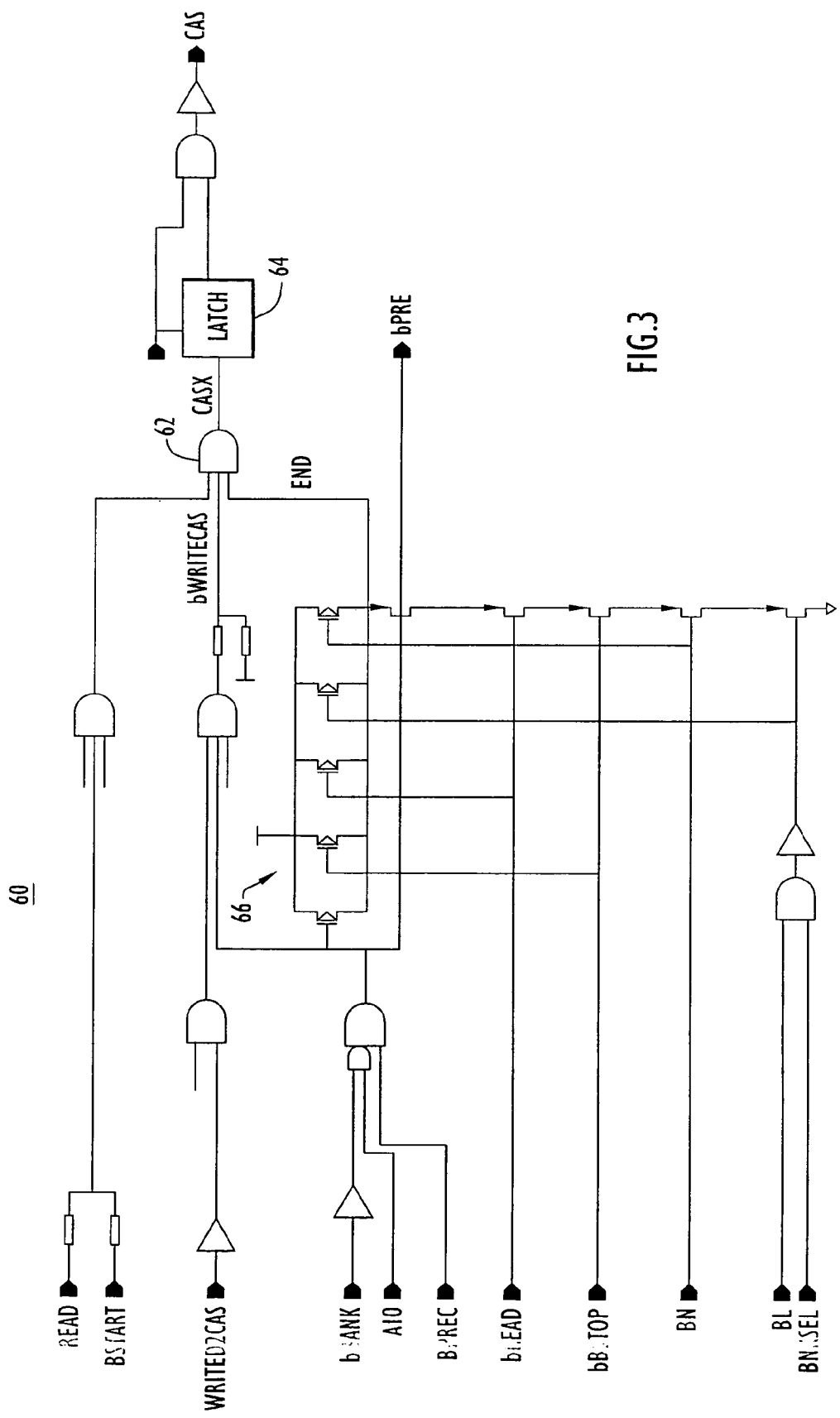
FIG. 3 is a detailed block diagram of the digital logic circuitry used to block a column address strobe signal according to an embodiment of the invention.

Turning to FIG. 3, the CAS latch and CAS generation circuitry 60 will be described in greater detail. As indicated above, there is an instance of the circuitry shown in FIG. 2 for each bank of the memory device. The normal operation of the circuitry for non-terminated write bursts is as follows. WRITED2CAS goes high a write latency of two cycles after the WRITE CMD. This sets the signal bWRITECAS low and the signal CASX high at the output of the NAND gate 62. An edge of the CLK signal latches the CASX signal in latch circuit 64 and creates a pulse in the output CAS signal. The width of the CAS pulse is determined by the duration of the high time of the CLK signal, thereby providing the first CAS pulse for a write burst. After the CASX has been latched by the CLK signal, WRITED2CAS returns low, which would shut CASX off if not for the following operation.

To generate the remaining CAS pulses for a burst, the END signal is low, which forces CASX high to be latched the same way as described above. The END signal is brought low by a five input NAND gate 66 comprised of five horizontal PFETs and five vertical NFETs. Each of the inputs to the NAND gate 66 must be high to generate a low END signal and therefore a high CASX. The bottom input (BL and BNKSEL) is "1" for the block that corresponds to the bank that is to be written. The signal BN is "1" for as long as the write burst has not completed; that is, reached the write burst has not reached the burst length set in a mode register for the memory device. The signal bSTOP is high until a burst terminate command is applied. The other signals shown in FIG. 3 are not relevant to the functions described herein and for these purposes these signals are considered to be high.

When a burst reaches the burst length, the burst counter (not shown) issues a signal that causes BN to go low. This brings END high, which in turn causes CASX to go low. When CASX goes low, this means that when the next CLK arrives, a CAS pulse will not be issued. CAS pulses are completed for that burst.

For a write burst terminated with a BST command occurring after at least one CAS pulse has been issued, the operation is as described above subject to the following. When a BST command is issued to the memory device, bBSTOP goes low. This brings END high, which causes CASX to go low. Again, when CASX goes low, this means that when the next CLK edge arrives, a CAS pulse will not be issued. In this way, the BSTOP command ends the CAS pulses, and consequently no further data already in the memory device will be transferred to the memory array. Moreover, the write latency FIFO circuit 40 outputs a memory bank specific column address strobe control signal, i.e., WRITE2CAS<0:3>. When a write burst stop command is processed, the particular burst control circuit for the particular memory array bank undergoing a write operation terminates generation of pulses for the column address strobe signal.

Figure 4:
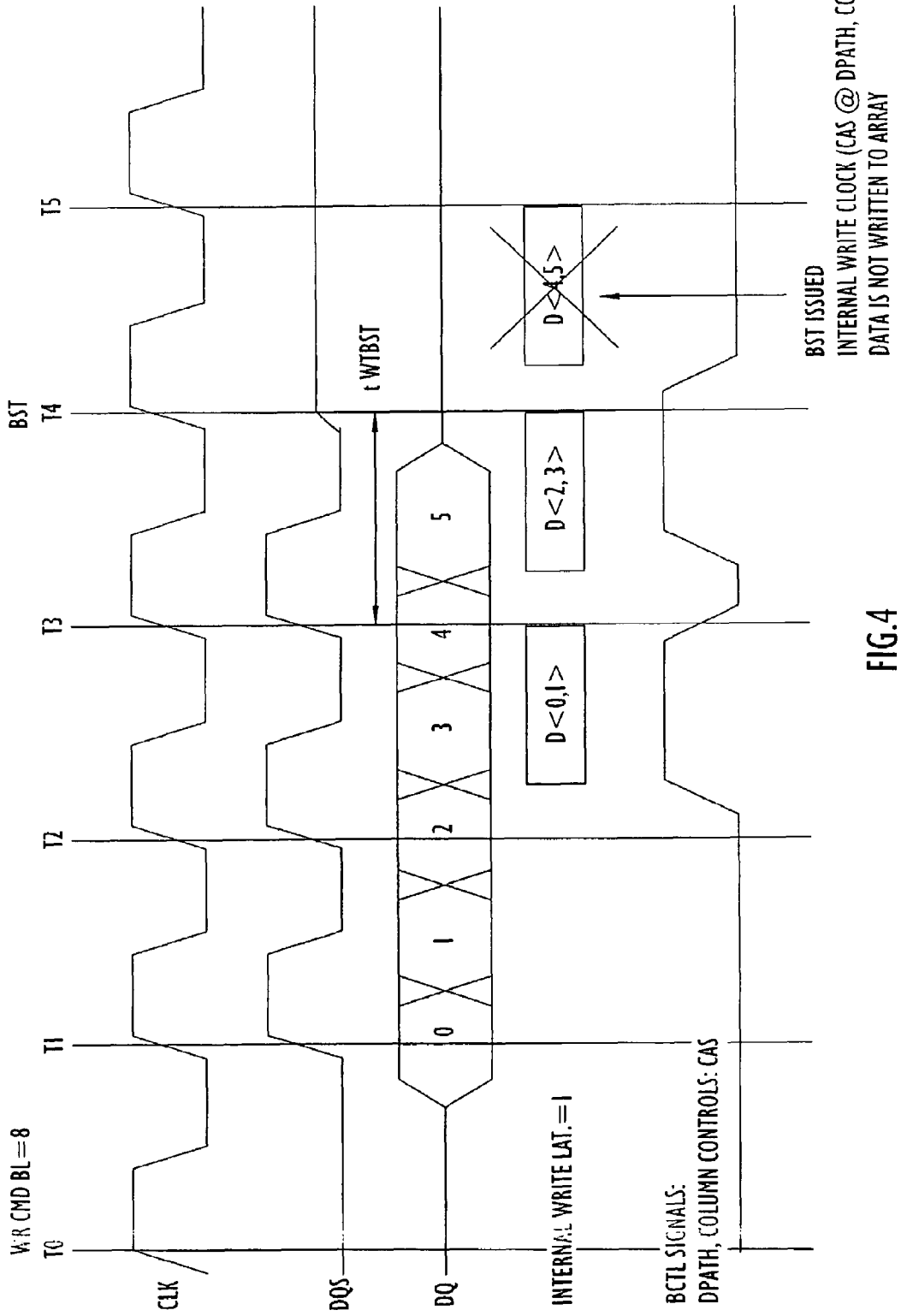
FIG. 4 is a timing diagram of the signals involved in the write burst interrupt function according to an embodiment of the invention.

Turning to FIGS. 4 and 5, taken in conjunction with FIG. 1, the operation 300 of the burst write termination function will be described. The command signal sequence is as follows.

A write burst operation begins in step 310 in response to the WRITE CMD. In this example, the write burst operation is for bitline (BL)=8. In step 320, the write latency FIFO is started as described above in conjunction with FIG. 2. Data is clocked into the receive buffer and to the data path circuit 90, and eventually into the memory array 75. Specifically, in this example the internal write latency in a DDR SDRAM is 1 clock cycle after the data is latched at the DQ. For example, DATA D<0,1> latched at the DQ at the T1 clock cycle (rising and falling clock edge) is written internal to the array at T2. That is, at the T2 clock cycle, while DATA D<2,3> are latched at the DQ, the previous data D<0, 22 are latched in the data path and transferred through the column path into the memory array. Starting at the T2 clock cycle, the BCTL control output signals are activated and remain active until the last data for the write burst sequence is written as described above in conjunction with FIG. 3.

A BST command is received to terminate the write burst operation at step 330, and in this example, the BST command is received at T4. In step 340, a determination is made whether the latency period of the write latency FIFO is still occurring. If it is, then in step 350, the write latency FIFO is reset as explained above in conjunction with FIG. 3. If the latency period of the write latency FIFO has passed, or after the FIFO is reset if the latency period is still occurring, in step 360 pulses for the CAS signal to the data path circuit 90 and to the memory array (column decoder) 75 are blocked to prevent further transfer of data from the data path circuit to the memory array. In the case where the BST command is received at T4, generation of the CAS pulses are blocked or stopped, and consequently the data D<4,5> from the previous cycle T3 are not transferred and written to the array.

The system and methods described herein may be embodied in other specific forms without departing from the spirit or essential characteristics thereof. The foregoing embodiments are therefore to be considered in all respects illustrative and not meant to be limiting.

What is claimed is:

1. A method for interrupting a write burst in a low power double data rate memory device, comprising:
   a. receiving a write burst stop command while a write operation is occurring;
   b. determining whether an initial write latency period is occurring when the write burst stop command is received;
   c. if the initial write latency period is occurring when the write burst stop command is received, resetting a write latency first-in first-out circuit; and
   d. blocking generation of pulses in a column address strobe signal that is coupled to a data path circuit and a column decoder associated with a memory array thereby terminating transfer of data to the memory array.

2. The method of claim 1, wherein blocking comprises disabling an input to a latch circuit that outputs pulses for the column address strobe signal.

3. A method for interrupting a write burst in a low power double data rate memory device, comprising:

a. receiving a write stop command while a write operation is occurring;

b. when the write burst stop command is received at the beginning of the write operation before pulses of a column address strobe signal are generated to transfer data into a memory array, resetting a first-in first-out circuit that provides a write latency for writing data received at the memory device into the memory array; and c. terminating generation of pulses for the column address strobe signal that is coupled to a data path circuit and a column decoder associated with the memory array thereby stopping transfer of data to the memory array.

4. The method of claim 3, wherein terminating comprises disabling an input to a latch circuit that outputs pulses for the column address strobe signal.

5. A memory device comprising:

a command decoder circuit that is responsive to a first command to initiate a write function and generate a write burst command and responsive to a second command to stop a write burst function and generate a write burst stop command;

a data receiver buffer circuit that receives data supplied to the memory device;

a burst control circuit coupled to the command decoder circuit that is responsive to the write burst command to generate pulses for a column address strobe signal that is supplied to a column decoder for performing a write burst function and responsive to the write burst stop command to terminate generation of pulses for the column address strobe signal;

a data path circuit connected to the data receive buffer circuit that writes data to a memory array in response to the column address strobe signal from the burst control circuit; and a first-in first-out circuit that is connected to the command decoder circuit and responsive to the write burst command to generate a column address strobe control signal that is supplied to the burst control circuit, wherein the column address strobe control signal is delayed from the first command by a latency period comprised of a predetermined number of clock cycles from receipt of the write burst command, and wherein the burst control circuit is responsive to the column address strobe control signal to output pulses in the column address strobe signal;

wherein the first-in first-out circuit is further responsive to the write burst stop command to asynchronously reset when the write burst stop command is received during an initial latency period at the beginning of a write burst prior to generation of pulses for the column address strobe signal.

6. The memory device of claim 5, and further comprising multiple memory banks and a burst control circuit and a data path circuit for each memory array bank, and wherein the column address strobe control signal output by the first-in first-out circuit is specific to a particular burst control circuit for a particular memory array bank so that pulses of the column address strobe signal are terminated for an appropriate memory array bank to which data is being written.

7. A memory device comprising:

a command decoder circuit that is responsive to a first command to initiate a write function and generate a write burst command and responsive to a second command to stop a write burst function and generate a write burst stop command;

a data receiver buffer circuit that receives data supplied to the memory device;

a burst control circuit coupled to the command decoder circuit that is responsive to the write burst command to generate pulses for a column address strobe signal that is supplied to a column decoder for performing a write burst function and responsive to the write burst stop command to terminate generation of pulses for the column address strobe signal, wherein the burst control circuit comprises:

a latch circuit that has a clock input to receive a clock signal and outputs the column address strobe signal at cycles of the clock signal; and a gate circuit that receives a signal derived from the column address strobe control signal and a signal derived from the write burst stop command and outputs a control signal to the latch circuit such that the latch circuit stops generating pulses in the column address strobe signal in response to a particular status of the signal to the gate circuit that is derived from the write burst stop command;

a data path circuit connected to the data receive buffer circuit that writes data to a memory array in response to the column address strobe signal from the burst control circuit; and a first-in first-out circuit that is connected to the command decoder circuit and responsive to the write burst command to generate a column address strobe control signal that is supplied to the burst control circuit, wherein the column address strobe control signal is delayed from the first command by a latency period comprised of a predetermined number of clock cycles from receipt of the write burst command, and wherein the burst control circuit is responsive to the column address strobe control signal to output pulses in the column address strobe signal.

8. A memory device comprising:

first means responsive to a write command for generating a column address strobe control signal, wherein the column address strobe control signal is delayed by a predetermined latency period from receipt of the write command, wherein the first means is further responsive to the write stop command to asynchronously reset when the write stop command is received during a time interval at the beginning of a write operation;

second means responsive to the column address strobe control signal for generating pulses in a column address strobe signal that is supplied to a column decoder for performing a write function and responsive to a write stop command to block generation of pulses in the column address strobe signal; and third means coupled to said second means for transferring data to a memory array in response to pulses in the column address strobe signal.

9. The memory device of claim 8, wherein the second means comprises:

a latch circuit that has a clock input to receive a clock signal and outputs the column address strobe signal at cycles of the clock signal; and a gate circuit that receives a signal derived from the column address strobe control signal and a signal derived from the write stop command and outputs a control signal to the latch circuit such that the latch circuit stops generating pulses in the column address strobe signal in response to a particular status of the signal to the gate circuit that is derived from the write stop command.

* * * * *